US005815028A

United States Patent [19]

Reynolds

[11] Patent Number: 5,815,028

[45] Date of Patent: Sep. 29, 1998

[54] METHOD AND APPARATUS FOR FREQUENCY CONTROLLED BIAS CURRENT

[75] Inventor: David C. Reynolds, Dove Canyon, Calif.

[73] Assignee: Analog Devices, Inc., Norwood, Mass.

[21] Appl. No.: 714,198

[22] Filed: Sep. 16, 1996

[51] Int. Cl.[6] .................................................... H03K 3/01

[52] U.S. Cl. ........................... 327/543; 327/538; 327/535

[58] Field of Search .................................... 327/535, 536, 327/538, 543; 323/312

[56] References Cited

U.S. PATENT DOCUMENTS

| | | | |
|---|---|---|---|
| 3,562,668 | 2/1971 | Bartlett | 327/535 |
| 4,862,015 | 8/1989 | Grandfield | 307/270 |
| 5,172,018 | 12/1992 | Colandrea et al. | 307/571 |
| 5,243,231 | 9/1993 | Baik | 307/296.3 |
| 5,293,112 | 3/1994 | Takahashi | 323/315 |

OTHER PUBLICATIONS

Steininger, John M. "Understanding Wide–band MOS Transistors," *Circuits and Devices,* May 1990, pp. 28–31.

*Primary Examiner*—Timothy P. Callahan
*Assistant Examiner*—An T. Luu
*Attorney, Agent, or Firm*—Wolf, Greenfield & Sacks, P.C.

[57] ABSTRACT

An integrated circuit includes a signal generator that receives an input signal having a frequency indicative of the operating frequency of the integrated circuit. The signal generator generates an intermediate signal having a magnitude that is dependent both upon the frequency of the input signal and on another factor such as a controlled resistance. A feedback circuit receives the intermediate signal, and provides control to the controlled resistance to maintain the magnitude of the intermediate signal within a predetermined range. Thus, the magnitude of the controlled resistance is adjusted based upon the operating frequency of the integrated circuit, and the feedback signal also is related to the operating frequency. The feedback signal may then be used to adjust the bias current, so that the bias current has a magnitude that is based upon a frequency at which the integrated circuit operates, resulting in more efficient power utilization with respect to operating frequency.

64 Claims, 9 Drawing Sheets

METHOD AND APPARATUS FOR FREQUENCY CONTROLLED BIAS CURRENT

BACKGROUND OF THE INVENTION

1. Field of the Invention

This invention relates generally to circuits using a bias current, and more particularly to a method and apparatus for controlling the bias current based upon a frequency at which a circuit operates.

2. Discussion of the Related Art

Current sources are used widely in analog, digital, and mixed-signal circuits as biasing elements. Such biasing can result in improved immunity of circuit performance to power supply variations, temperature variations, noise, and other factors. Transistor current sources typically are more economical than resistor implementations with respect to the amount of die area required within an integrated circuit.

A typical arrangement of a bias current source is illustrated in FIG. 1. The circuit of FIG. 1 includes reference transistor 10, having a source terminal coupled to a first power supply voltage Vcc. The gate and drain terminals of reference transistor 10 are coupled to a common node referred to as a bias control node. This bias control node is further coupled to a control circuit 11. Bias transistor $\mathbf{12}_1$ also has a source terminal coupled to the power supply voltage Vcc, and a gate terminal coupled to the bias control node. Additional bias transistors, such as bias transistors $\mathbf{12}_2$–$\mathbf{12}_N$ may be coupled to the reference transistor 10 and the power supply voltage Vcc in a similar fashion. The drain terminal of each bias transistor $\mathbf{12}_1$–$\mathbf{12}_N$ may be coupled to additional circuitry respectively to provide bias currents $i_{bias1}$–$i_{biasN}$ to such additional circuitry, as discussed in more detail below.

The control circuit 11 includes a voltage reference 19 that provides a voltage Vref to a noninverting input 16 of an operational amplifier 15. The output 18 of the operational amplifier 15 is coupled to the gate terminal of an NMOS control transistor 14, the drain of which is coupled to the bias control node—to the gate and drain terminals of the reference transistor 10. A control resistor 13 is coupled between the source terminal of the control transistor 14 and a second power supply voltage Vss which typically is a ground reference. The inverting input 17 of the operational amplifier 15 is coupled to the source terminal of control transistor 14, in order to complete a feedback path. As a result of the feedback path, operational amplifier 15 provides a voltage to the gate terminal of control transistor 14, sufficient to approximately maintain a constant voltage at the source terminal of control transistor 14, which in turn determines reference current $i_{ref}$ drawn by reference transistor 10.

For example, if the reference current $i_{ref}$ begins to decrease for some reason, such as a decrease in supply voltage Vcc, then the voltage at the source terminal of control transistor 14 also will decrease, because the voltage across control resistor 13 is equal to the resistance across control resistor 13 multiplied by the reference current $i_{ref}$. This voltage is fed back to the inverting input 17 of operational amplifier 15, which in turn will provide a higher output at the gate terminal of control transistor 14. This higher output will decrease the source-drain voltage of control transistor 14 until the voltage across control resistor 13 is equal to Vref, thus approximately maintaining $i_{ref}$ at a predetermined amperage. Similarly, control circuit 11 will respond to an increase in reference current $i_{ref}$ to approximately maintain the predetermined amperage.

With such an arrangement, each of the bias transistors $\mathbf{12}_1$–$\mathbf{12}_N$ provides a controlled bias current (e.g., $i_{bias1}$, $i_{bias2}$, . . . $i_{biasN}$, respectively) having an amperage that is approximately proportional to that of the current $i_{ref}$ drawn through reference transistor 10. The magnitude of each controlled bias current will thus be maintained despite variations of the power supply voltage Vcc, and despite variations in the resistance provided by the additional circuitry which receives the controlled bias currents. Any of the bias transistors $\mathbf{12}_1$–$\mathbf{12}_N$ may be made with similar structure (e.g., channel length, channel width) to that of the reference transistor 10, to provide a bias current $i_{bias}$ that is substantially equal to the reference current $i_{ref}$.

Alternatively, any of the bias transistors $\mathbf{12}_1$–$\mathbf{12}_N$ may be fabricated with a different structure than reference transistor 10, to provide a bias current $i_{bias}$ that is different from, but proportional to, reference current $i_{ref}$. For example, if bias transistor $\mathbf{12}_1$ has a channel length to channel width ratio (Z/L) that is twice that of the channel length to channel width ratio (Z/L) of the reference transistor, then the bias current $i_{bias1}$ will approximately be twice that of the reference current $i_{ref}$ within the operating ranges discussed above. Other characteristics of bias transistors $\mathbf{12}_1$–$\mathbf{12}_N$ may be altered to provide different relationships between each of the bias currents $i_{bias}$ and the reference current $i_{ref}$.

FIG. 1 depicts an implementation in which the reference transistor 10 and the bias transistors $\mathbf{12}_1$–$\mathbf{12}_N$ are PMOS transistors. NMOS transistors, other types of MOS transistors, and bipolar transistors may be used instead with similar results. Similar substitutions may be made with respect to the elements of control circuit 11, as well as for any of the circuits disclosed in this specification.

FIG. 2 illustrates a differential op-amp circuit 21 which may be biased by a respective one of the bias currents $i_{bias1}$–$i_{biasN}$ generated by the circuitry shown in FIG. 1. The differential op-amp circuit 21 includes a source-coupled pair of input transistors 24, 25, each having a gate terminal that receives one of a pair of differential input voltages Vin1, Vin2. Current source 22 provides a controlled current $i_{c2}$ to the drain terminal of input transistor 24, and current source 23 provides a controlled current $i_{c2}$ to the drain terminal of input transistor 25. The output voltage Vout of the differential op-amp circuit 21 is measured between the drain terminal of transistor 24 and the drain terminal of transistor 25.

Transistors 26 and 27 together form a current source which draws a constant amount of source current $i_s$ from the node that connects the source terminals of transistors 24, 25. Current source transistor 27 has a drain terminal coupled to the source terminals of input transistors 24, 25. The gate and drain terminals of transistor 26 are coupled together and receive the bias current $i_{bias}$, for example, from bias transistor $\mathbf{12}_1$ in FIG. 1. The gate terminal of current source transistor 27 also is coupled to the gate and drain terminals of transistor 26. Accordingly, because bias current $i_{bias}$ has a predetermined amperage due to the arrangement shown in FIG. 1, the voltage at the gate terminals of transistors 26 and 27 is at a predetermined magnitude, and thus, transistor 27 draws an approximately constant predetermined amount of source current is from the source terminals of input transistors 24, 25. (For a further discussion of current sources and associated analog circuits, see Paul R. Gray, and Robert G Meyer, *Analysis and Design of Analog Integrated Circuits* (2nd ed. 1984), pp 233–300, 705–737, incorporated by reference herein).

The response time of a circuit such as the differential op-amp 21 is highly dependent upon two factors, namely parasitic capacitance of the circuit and the source current $i_s$. Examples of parasitic capacitances include capacitor 28 and capacitor 29, shown in FIG. 2. Capacitor 28 is coupled between the drain terminal of transistor 24 and a voltage reference such as ground, and capacitor 29 is coupled between the drain terminal of transistor 25 and a voltage reference such as ground. In practice, parasitic capacitances exist to some degree at every node of all circuits. These parasitic capacitances slow down the switching of a circuit such as the differential op-amp 21, because in order to transition the output voltage Vout from a negative voltage to a positive voltage for example, capacitor 28 must be discharged and capacitor 29 must be charged. The charging time of a capacitor is related to the current available to charge the capacitor, and the capacitance of the capacitor itself. For example, if the amperage of bias current $i_s$ is increased while the value of each of the parasitic capacitors 28, 29 is maintained to be approximately constant, the switching speed of the differential op-amp circuit 21 will be increased. Thus, the speed at which a circuit may operate is dependent upon both the parasitic capacitances and the source current $i_s$. As discussed above, the source current is of any such circuit is dependent upon a bias current $i_{bias}$.

These concepts apply to many types of circuits and devices such as analog-to-digital converters (ADCs), digital-to-analog converters (DACs), sample and hold circuits, multiplexors, analog switches, voltage references, and digital signal processors. Typically, in the design of such circuits, a bias current of such a circuit is predetermined, when the circuit is designed, to have an amperage high enough to support the desired speed or operating frequency. Additionally, the predetermined amperage of the bias current must also be sufficient to support the desired operating frequency despite variations in other factors such as variations in the semiconductor fabrication process, variations in supply voltage, and variations in operating temperature. Thus, in the prior art, the bias current $i_{bias}$ was predetermined to be a worst-case current yielding suitable circuit operation despite all possible negative combinations of variations of these factors.

Although a higher bias current may facilitate a higher operating frequency, a higher bias current also results in a higher power requirement for the entire device. A higher power requirement is undesirable due to power consumption, heat dissipation, and other adverse impacts. For example, a particular integrated circuit may be designed to have a bias current of 250 mA, so that at worst case conditions, the circuit may operate at an operating frequency of 10 MHZ. If a user has an application that will never require operation of the integrated circuit at greater than 1 MHZ, the 250 mA bias current represents a significant amount of wasted power, even in steady state conditions, because the bias current is drawn whenever the circuit is connected to a supply voltage.

Accordingly, in the prior art, if a particular application required a higher operating frequency than the operating frequency for which an existing integrated circuit was designed, then an application-specific integrated circuit would be designed and developed for that particular application which could operate at the higher operating frequency, at considerable expense and time delays.

Additionally, there are applications which require an integrated circuit to operate at several different frequencies. For example, a ADC may be idle during some time intervals, and operate in a burst mode where it converts at a high rate during other time intervals. As described above, however, the worst-case amperage of the bias current is being dissipated all the time, whether or not the integrated circuit is actually operating at the worst-case frequency.

It would be desirable to provide an integrated circuit with a bias current having an amperage that is based upon a frequency at which the integrated circuit operates.

SUMMARY OF THE INVENTION

According to one aspect of the invention, an integrated circuit includes a signal generator that receives an input signal having a frequency indicative of the operating frequency of the integrated circuit. The signal generator generates an intermediate signal having a magnitude that is dependent both upon the frequency of the input signal and on another factor such as a controlled resistance. A feedback circuit receives the intermediate signal, and provides control to the controlled resistance to maintain the magnitude of the intermediate signal within a predetermined range. Thus, the magnitude of the controlled resistance is adjusted based upon the operating frequency of the integrated circuit, and the feedback signal also is related to the operating frequency. The feedback signal may then be used to adjust the bias current, so that the bias current has a magnitude that is based upon a frequency at which the integrated circuit operates, resulting in more efficient power utilization with respect to operating frequency.

An illustrative embodiment of the invention is directed to a bias circuit for providing a bias current to an integrated circuit. The bias circuit includes a signal generator having an input responsive to an input signal that has a frequency indicative of an operating speed of the integrated circuit, and an output that provides an intermediate signal indicative of the operating speed. Also included is a controllable bias current generator, having an input responsive to the intermediate signal, and an output that provides a bias current having a magnitude that is a function of the frequency of the input signal. The bias circuit may further comprise a feedback controller, having an input that receives the intermediate signal and an output that provides a feedback signal indicative of the operating speed to the input of the controllable bias current generator and to a second input of the signal generator.

An embodiment of the feedback controller includes a window comparator, having an input that receives the intermediate signal and an output providing a control signal indicative of whether the intermediate signal is within a predetermined range, and a binary counter, having an input that receives the control signal, and an output that provides a resistance control signal as the feedback signal in response to the control signal.

An embodiment of the signal generator includes a controlled resistance, a controlled switch, responsive to the input signal, and an integration circuit, having a first input that receives a signal indicative of the controlled resistance and a second input receiving a signal indicative of a position of the controlled switch, and an output that provides the intermediate signal as a function of the controlled resistance and the controlled switch.

An embodiment of the controllable bias current generator includes a current mirror providing a first current and a second current having a magnitude substantially equal to the first current, a controlled resistance, and a plurality of transistors constructed and arranged to control the bias current to have a magnitude substantially proportional to an inverse of the controlled resistance.

Another aspect of the invention is directed to a method for controlling a bias current of a circuit, comprising the steps of receiving an input signal having a frequency indicative of an operating speed of the circuit, and generating the bias current to have a magnitude that is a function of the frequency of the input signal.

Another aspect of the invention is directed to an apparatus for controlling a bias current of a circuit, comprising means for receiving an input signal having a frequency indicative of an operating speed of the circuit, and means for generating the bias current to have a magnitude that is a function of the frequency of the input signal.

In another aspect of the invention, a method for controlling a bias current of an integrated circuit comprises the steps of receiving a signal indicative of an operating frequency of the integrated circuit, increasing the bias current in response to the signal indicating that the operating frequency of the integrated circuit is increasing, and decreasing the bias current in response to the signal indicating that the operating frequency of the integrated circuit is decreasing.

Yet another aspect of the invention is directed to an apparatus for controlling a bias current of an integrated circuit, comprising means for receiving a signal indicative of an operating frequency of the integrated circuit, means for increasing the bias current in response to the signal indicating that the operating frequency of the integrated circuit is increasing, and means for decreasing the bias current in response to the signal indicating that the operating frequency of the integrated circuit is decreasing.

In any of the embodiments, the bias current may be substantially linearly proportional to the operating speed or operating frequency of an integrated circuit, or may be substantially proportional to a square of the operating speed or operating frequency of an integrated circuit. Additionally, a bias control signal may be generated, from which a plurality of bias currents are generated and distributed to corresponding subcircuits on an integrated circuit. Moreover, the input signal may be a data strobe signal or a clock signal of an integrated circuit.

BRIEF DESCRIPTION OF THE DRAWINGS

Other features and advantages of the present invention shall appear from the following description of an exemplary embodiment, said description being made with reference to the appended drawings, of which.

DETAILED DESCRIPTION

Figure 1:
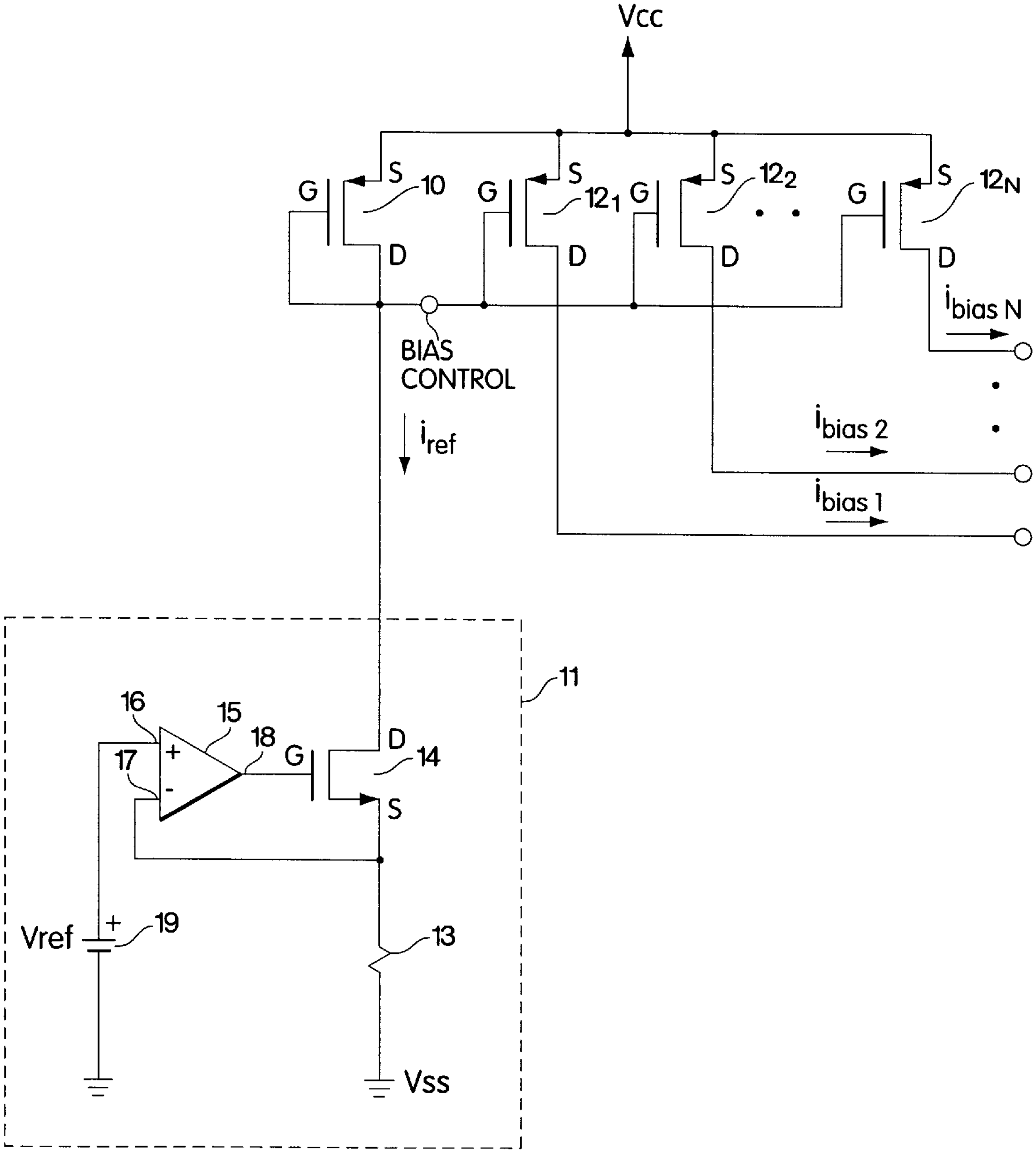
Fig. 1 (Prior Art)
FIG. 1 illustrates a prior art bias current generator.
Figure 2:
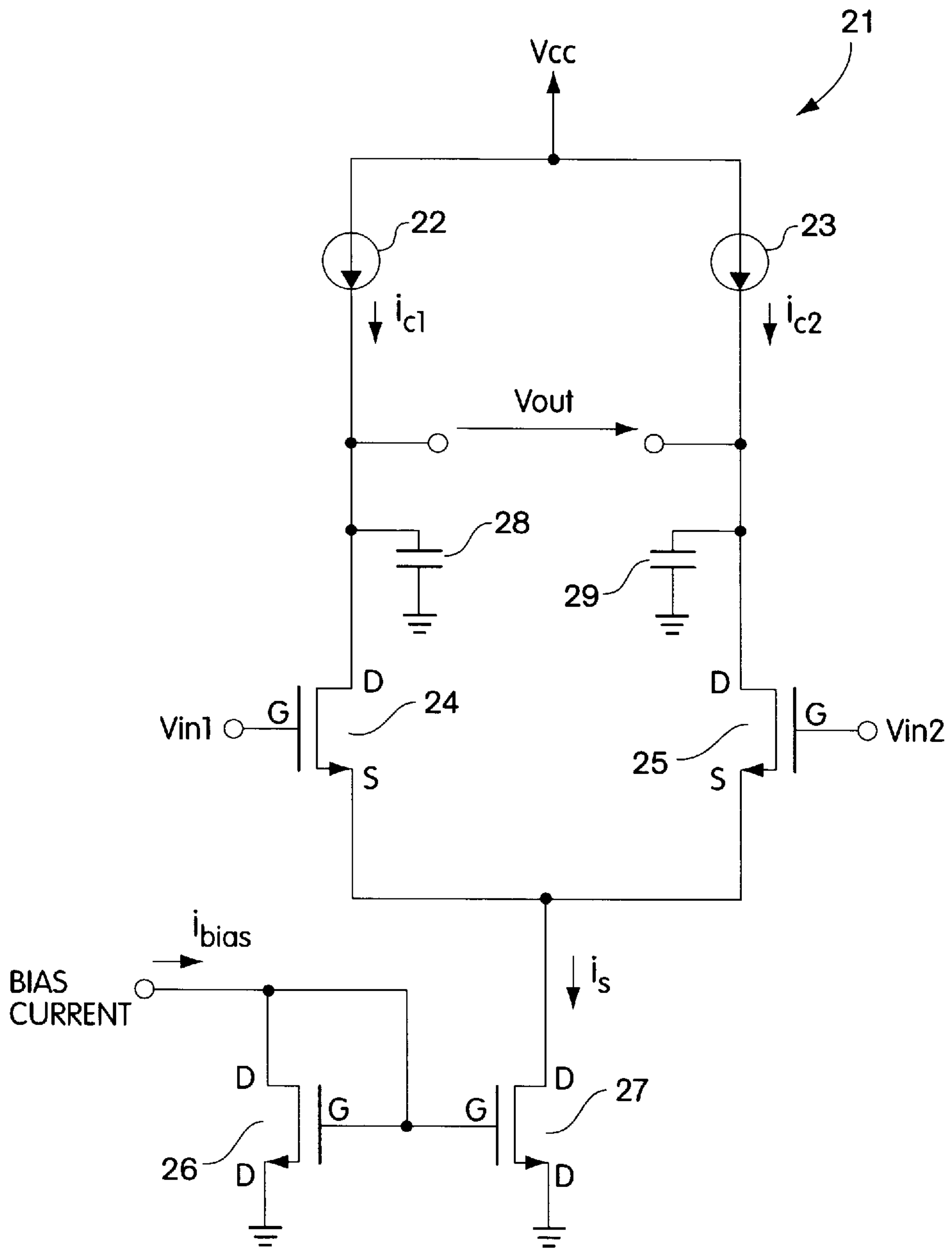
Fig. 2 (Prior Art)
FIG. 2 illustrates a typical circuit which uses the bias current generated by the circuit of FIG. 1.
Figure 3:
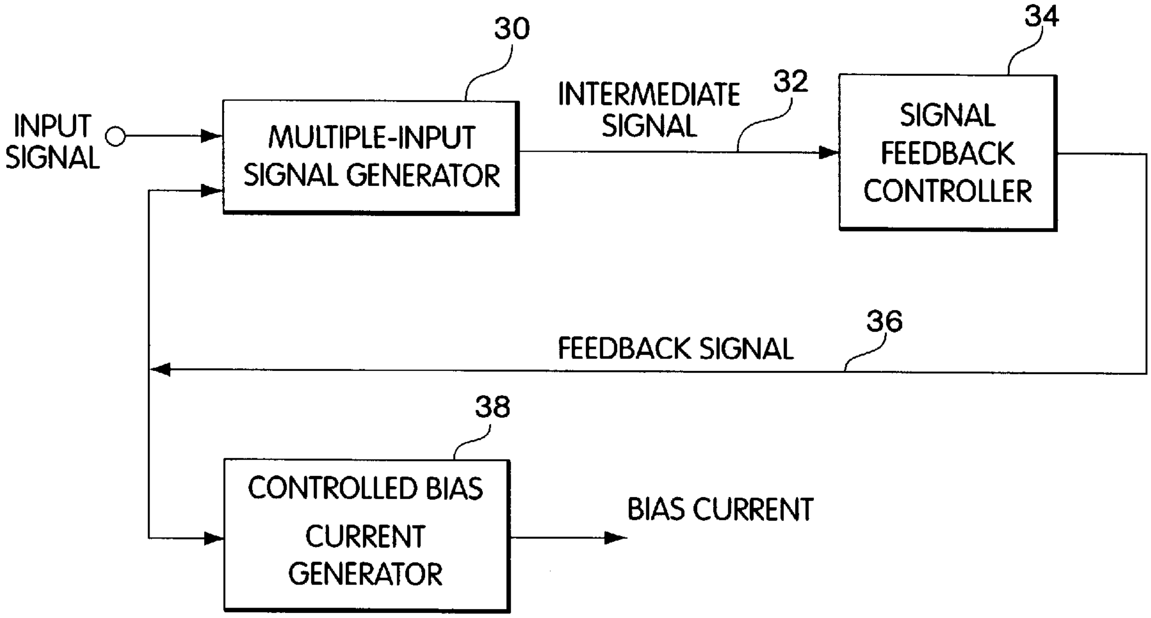
FIG. 3 is a block diagram of a bias current generator according to an embodiment of the invention.

FIG. 3 illustrates an embodiment of the invention including a circuit having a multiple-input signal generator 30, a signal feedback controller 34, and a controlled bias current generator 38. Such a circuit may be fabricated on an integrated circuit to provide a controlled bias current or a plurality of controlled bias currents to other circuits of the integrated circuit in a manner which overcomes the drawbacks of the prior art. The multiple-input signal generator 30 has a first input that receives an input signal, and a second input that receives a feedback signal 36 from the signal feedback controller 34. The multiple-input signal generator 30 provides as an output an intermediate signal to an input of the signal feedback controller 34, which provides as an output the feedback signal 36. The feedback signal 36 is also provided to the input of the controlled bias current generator 36. The controlled bias current generator 36 provides a bias current of an amperage that is dependent upon the feedback signal.

Figure 4:
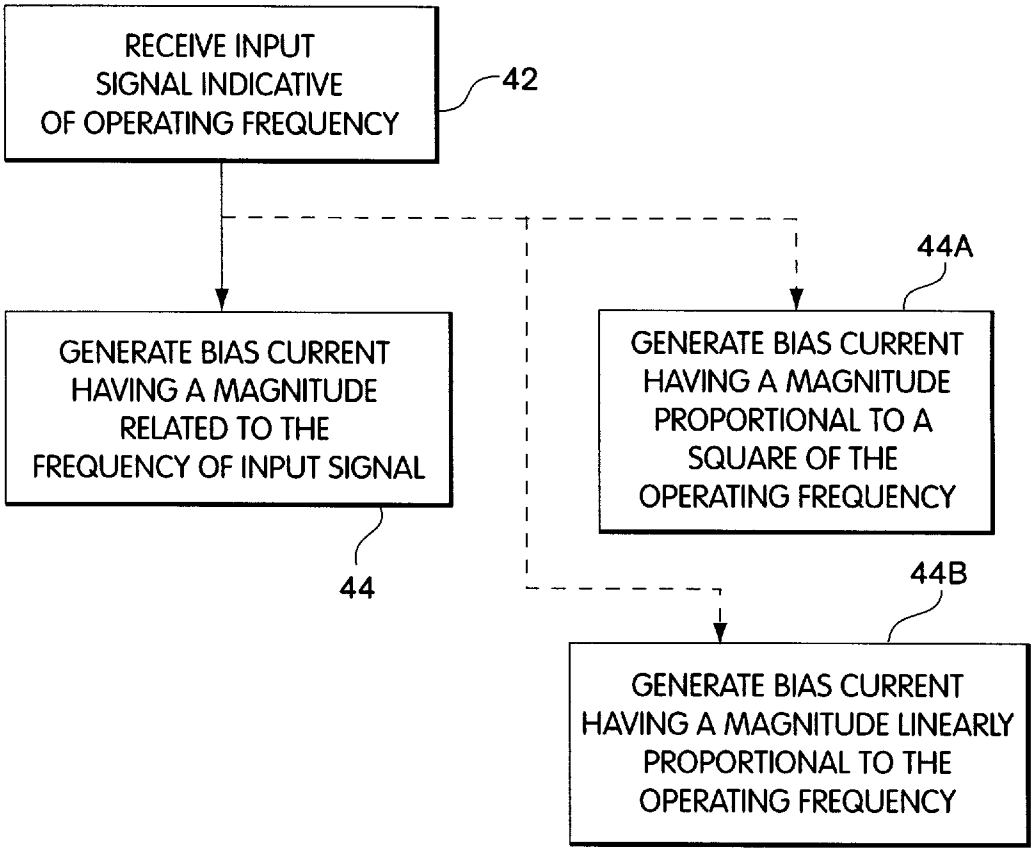
FIG. 4 is a flow diagram showing operation of one embodiment of the invention.

The flow diagram of FIG. 4 shows a process according to an embodiment of the present invention. The circuit illustrated in FIG. 3 represents one approach for performing the steps of the process of in FIG. 4. In step 42, an input signal is received. The input signal is indicative of the operating frequency of an integrated circuit. For example, the input signal may be a clock signal or a data strobe signal provided to the integrated circuit or generated internally by the integrated circuit. In step 44, a bias current is generated which has an amperage related to the frequency of the input signal (step 44).

In one embodiment, step 44A may be implemented in place of step 44. In step 44A, the bias current has an amperage that is approximately proportional to a square of the operating frequency. This approach may have particular advantages, discussed in more detail below. In another embodiment, step 44B may be implemented in place of step 44. In step 44B, the bias current has an amperage that is approximately linearly proportional to the operating frequency.

In operation, the signal feedback controller 34 provides a feedback signal 36 which controls the multiple-input signal generator 30 so that the intermediate signal 32 remains within a predetermined range. Because the same feedback signal 36 is provided to the controlled bias current generator 38, the bias current is controlled to have a amperage related to the magnitude of the feedback signal 36. As described in more detail below, this relationship is dependent upon the characteristics of multiple input signal generation 30, and the characteristics of controlled bias current generator 38.

Figure 5:
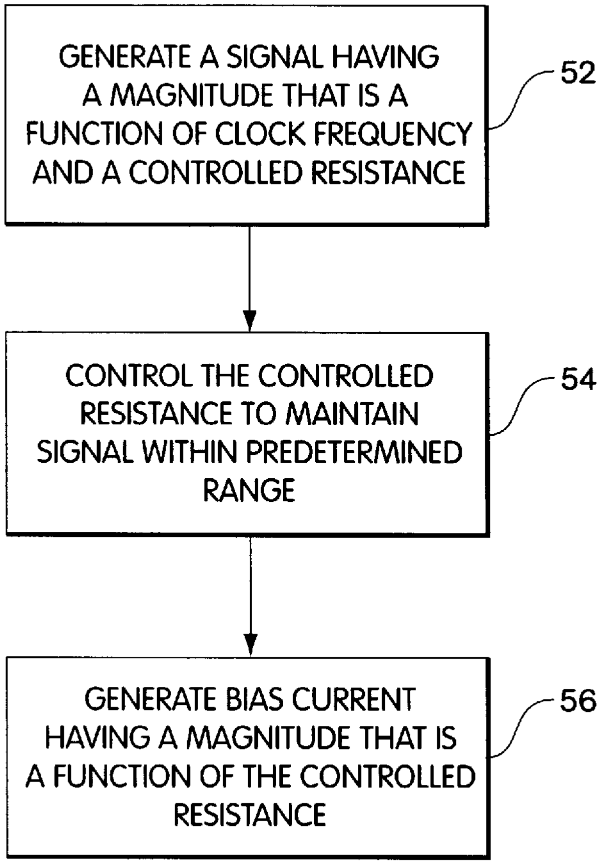
FIG. 5 is a flow diagram illustrating more detail of the flow diagram of FIG. 4.

In one embodiment, shown in FIG. 5, a signal is generated having a magnitude that is a function of a clock frequency and a first controlled resistance (step 52). This step may be performed by the multiple-input signal generator 30. In step 54, the first controlled resistance is controlled to maintain the signal within a predetermined range. In step 56, a bias current is generated that has an amperage that is a function of the controlled resistance. For example, the controlled bias current generator 38 may include a second controlled resistance that also is controlled by the feedback signal 36 in a fashion similar to that of the first controlled resistance. The feedback signal 36, for example, may include a parallel set of digital signals that control the resistance across each of two controlled resistance elements.

Figure 6:
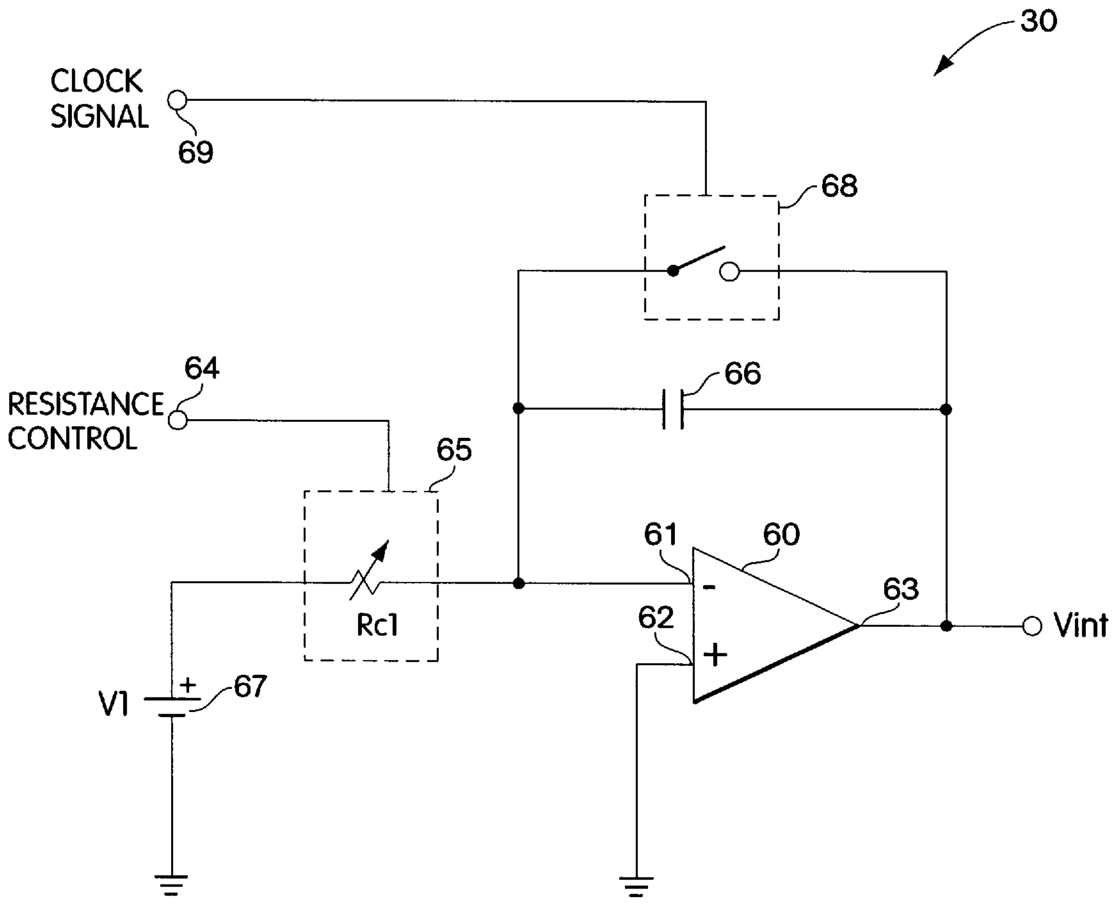
FIG. 6 is a circuit diagram of an embodiment of the multiple-input signal generator of FIG. 3.

FIG. 6 illustrates an embodiment of the multiple-input signal generator 30 in which the input signal is a clock signal 69, the feedback signal 36 is a resistance control signal 64, and the intermediate signal 32 is an integration voltage Vint. The clock signal may be any periodic signal relating to the operating frequency of an integrated circuit for which the bias current is provided. For example, the clock signal 69 may be a data strobe signal, an address strobe signal, or any other signal which represents the operating frequency of a circuit. The operating frequency of a circuit typically is the frequency at which the circuit performs a major function, for example, the frequency at which a DAC actually converts an input digital signal into an output analog signal.

In an embodiment shown in FIG. 6, the multiple-input signal generator 30 includes an operational amplifier 60, first controlled resistance element 65, voltage source 67 which provides voltage $V_1$, capacitor 66, and switch 68. The noninverting input 62 of operational amplifier 60 is coupled to a voltage source such as Vss, and the inverting input 61 of operational amplifier 60 is coupled to another voltage source such as $V_1$ generated by voltage source 67, through first controlled resistance element 65. First controlled resistance element 65 has a control input that receives the resistance control signal 64 in response to which the magnitude of the resistance Rc1 may be varied. An integration feedback path is formed by capacitor 66 and switch 68, both of which are connected in parallel between the inverting input 61 and the output 63 of operational amplifier 60. Switch 68 also has a control input that receives the clock signal 69.

The circuit shown in FIG. 6 generates integration voltage Vint having a magnitude that is dependent both upon the magnitude of the resistance Rc1 across first controlled resistance element 65, and upon the frequency of the clock signal 69, as described in more detail below. For example, if the clock signal 69 is in a low state, switch 68 will be in an open position and the resistance Rc1 will be at a stable value. In such a situation, capacitor 66 will be charged through resistance Rc1 until voltage Vint is equal to V1. However, when the clock signal 69 is activated (i.e., transitions from a low state to a high state), switch 68 will close, capacitor 66 will quickly discharge through the switch 68, and the operational amplifier 60 will provide an output voltage Vint that is approximately equal to the voltage at the noninverting input 62, which in this example is Vss. When switch 68 is opened, voltage Vint will increase again as described above.

The rate of increase of the magnitude of integration voltage Vint depends upon the value of capacitance of capacitor 66, and upon the magnitude of resistance Rc1 across controlled resistance element 65. The capacitance of capacitor 66 remains constant. However, in response to the resistance control signal 64, the resistance Rc1 across the first controlled resistance element 65 may be varied. Additionally, if the frequency of the clock signal 69 is increased, the magnitude of integration voltage Vint will not reach the magnitude of voltage V1 in the time before switch 68 closes again in response to a next edge of clock signal 69. Thus, an increase in the frequency of the clock signal 69 decreases the integration voltage Vint, and an increase in the magnitude of resistance Rc1 also decreases the voltage Vint. Accordingly, the multiple-input signal generator 30 may be implemented as shown in FIG. 6.

Figure 7:
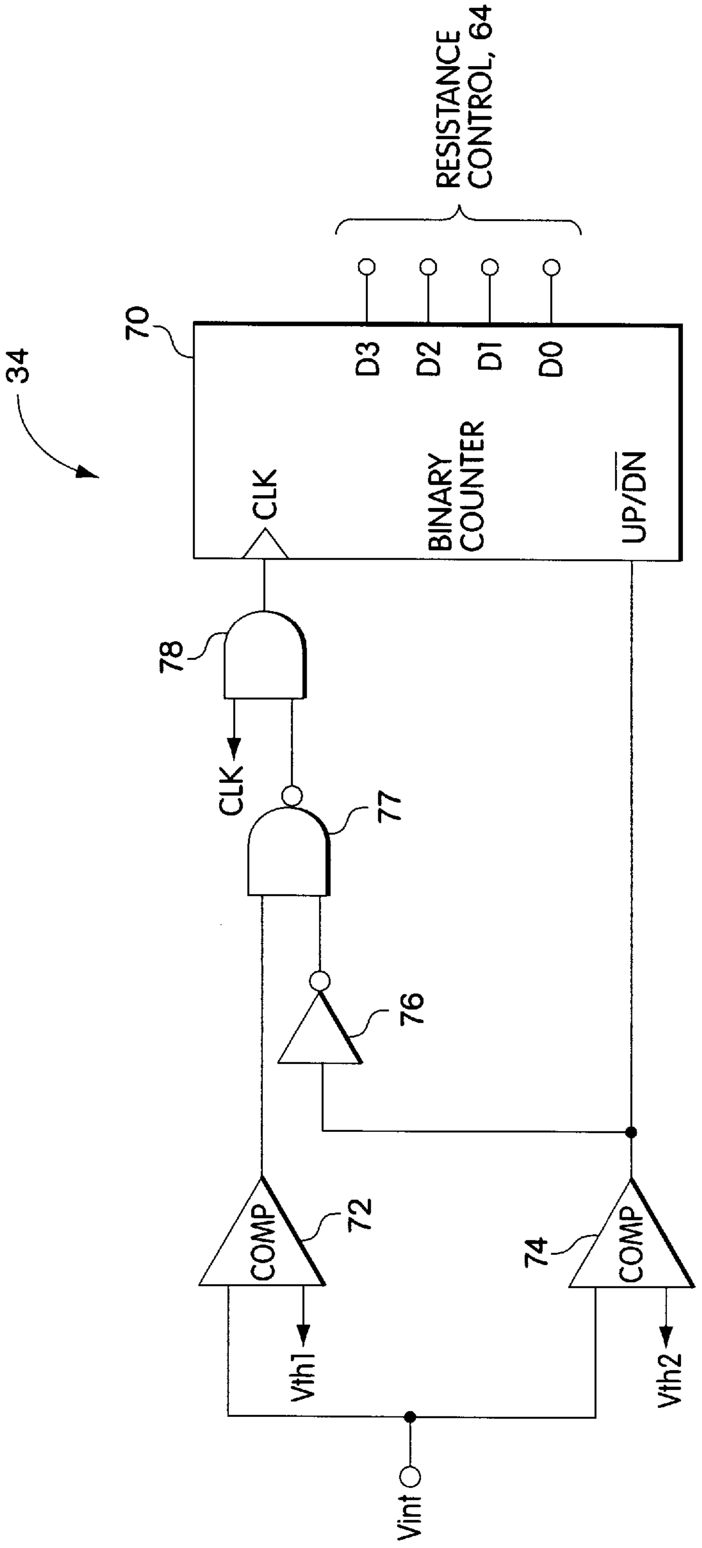
FIG. 7 is a circuit diagram of an embodiment of the signal feedback controller of FIG. 3.

FIG. 7 is a circuit diagram of an embodiment of the signal feedback controller 34. In combination with the multiple-input signal generator 30 shown in FIG. 6, the circuitry of FIG. 7 provides a feedback signal 36 as the resistance control signal 64. FIG. 7 illustrates binary counter 70 providing four parallel digital outputs D0–D3, which together represent the resistance control signal 64 that is input to first controlled resistance element 65 of FIG. 6. Binary counter 70 has an UP/DN input and a clock input. Comparator 72 and comparator 74 provide a window comparison for integration voltage Vint. Comparator 72 receives integration voltage Vint at one input, and a first threshold voltage Vth1 at a second input. Comparator 74 receives integration voltage Vint at one input, and a second threshold voltage Vth2 at a second input. The output of comparator 74 is coupled to the UP/DN input of the binary counter 70, as well as to the input of inverter 76, the output of which is coupled to one input of NAND gate 77. The second input of NAND gate 77 is coupled to the output of comparator 72, and the output of NAND gate 77 is coupled to an input of AND gate 78. A second input of AND gate 78 is coupled to a clock signal CLK, and the output of AND gate 78 is coupled to the clock input of the binary counter 70.

Binary counter 70 either counts up, counts down, or maintains a constant value at outputs D0–D3 depending upon the clock input and the UP/DN input. When the UP/DN input is at a high level and a clocking signal, (i.e., a rising edge), is received at the clock input, the binary output represented by signals D0–D3 will increment. When the UP/DN input is at a low level and a clocking signal is received at the clock input, the binary output represented by signals D0–D3 will decrement. If no clocking signal is received, the outputs D0–D3 will remain at their respective previous states. Clock signal CLK may be derived from the clock signal 69, or may be an independent clock signal provided by some other circuit.

In this embodiment, comparator 72 provides a digital output at a high level if the magnitude of integration voltage Vint exceeds the magnitude of first threshold voltage Vth1, and provides a digital output at a low level otherwise. Comparator 74 provides a digital output at a high level if the magnitude of integration voltage Vint exceeds the magnitude of second threshold voltage Vth2, and provides a digital output at a low level otherwise. The first threshold voltage Vth1 has a smaller magnitude than second threshold voltage Vth2. Thus, if the magnitude of integration voltage Vint is less than the magnitude of the first threshold voltage Vth1, the output of each of comparators 72, 74 will be at a low level. In such an instance, the UP/DN input of the binary counter 70 will be at a low level. Additionally, the output of NAND gate 77 will be at a high level, so that the output of AND gate 78 switches at a frequency of clock signal CLK. Accordingly, the binary counter 70 decrements while the magnitude of integration voltage Vint is less than the magnitude of the first threshold voltage Vth1.

If the magnitude of integration voltage Vint exceeds the magnitude of first threshold voltage Vth1 but remains less than the magnitude of second threshold voltage Vth2, the output of comparator 72 will be at a low level and the output of comparator 74 will be at a high level. In such an instance, both inputs of NAND gate 77 will be at a high level, causing the output of NAND gate 77 to be at a low level, which inhibits the output of AND gate 78 from switching. Therefore, if the magnitude of integration voltage Vth is between the magnitudes of first threshold voltage Vth1 and second threshold voltage Vth2, the binary counter 70 does not increment or decrement, but instead provides a constant output as represented by output signals D0–D3 remaining constant.

If the magnitude of integration voltage Vint exceeds both the magnitude of first threshold voltage Vth1 and the magnitude of second threshold voltage Vth2, the output of both comparators 72, 74 will be at a high level. The UP/DN input of the binary counter 70 will therefore be at a high level. Additionally, the output of NAND gate 77 will be at a high level, enabling the output of AND gate 78 to switch at a frequency of clock signal CLK, thus causing the binary counter 70 to increment.

The circuits of FIGS. 6–7 operate in conjunction to provide a resistance control signal 64 that has a magnitude that is dependent upon the frequency of the clock signal 69. If the clock signal 69 increases in frequency, the integration voltage Vint will decrease as described above with reference to FIG. 6. However, if the integration voltage Vint decreases below the magnitude of first threshold voltage Vth1, then the magnitude of resistance control signal 64 will decrease as described above with reference to FIG. 7. A decrease in the magnitude of resistance control signal 64 will decrease the resistance Rc1 across first controlled resistance element 65, which will increase the rate at which capacitor 66 charges, until the magnitude of integration voltage Vint again remains within the range between the magnitude of first threshold voltage Vth1 and the magnitude of second threshold voltage Vth2.

Conversely, if the clock signal 69 decreases in frequency, the magnitude of integration voltage Vint will increase, which will cause a increase in the magnitude of resistance control signal 64 as long as the decrease in frequency of clock signal 69 is sufficient for integration voltage Vint to exceed second threshold voltage Vth2. Accordingly, the resistance Rc1 across first controlled resistance element 65 will be increased. Thus, the magnitude of the resistance Rc1 is inversely proportional to a frequency of the clock signal 69. If the resistance control signal 64 is used to generate a bias control signal that has a magnitude inversely related to the resistance control signal 64, then the respective amperages of bias currents controlled by the bias control signal will increase in response to an increase in clock signal 69, and will decrease in response to a decrease in clock signal 69.

Alternatively, other circuits or systems may be used to provide an intermediate signal 32 and feedback signal 36. For example, the functions depicted in FIGS. 4–5 may be performed by a general purpose computer including a central processing unit, program memory, and random access memory. Additionally, other controlled values may be used in place of controlled resistance Rc1, such as controllable current sources or controllable voltage sources.

Figure 8:
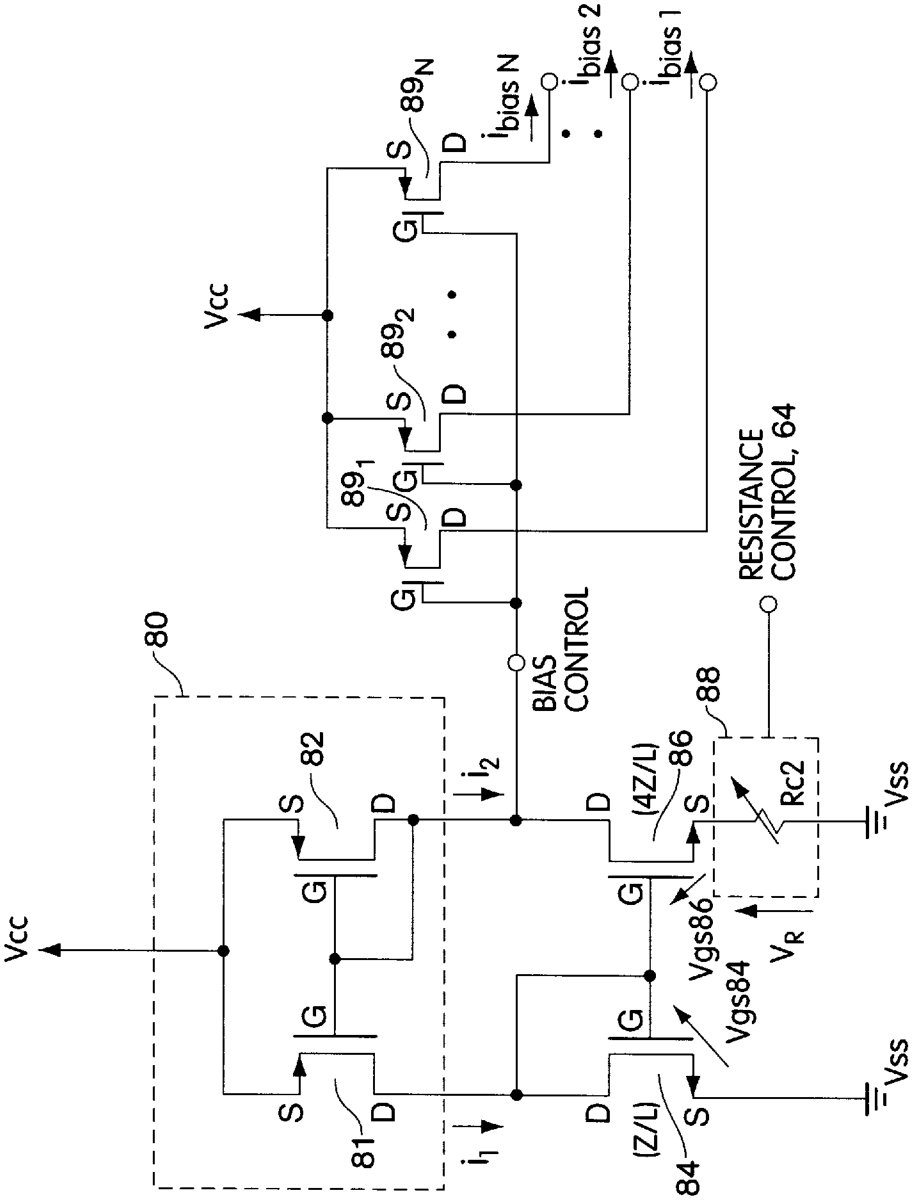
FIG. 8 is a circuit diagram of an embodiment of the controlled bias current generator of FIG. 3.

FIG. 8 is a circuit diagram of one embodiment of the controlled bias current generator 38 of FIG. 3. The circuit depicted in FIG. 8 may be used in conjunction with the circuits described with reference to FIGS. 6–7, or may be used in conjunction with other alternative embodiments to these circuits. FIG. 8 shows a current mirror 80 that provides a bias current i, having an amperage approximately equal to the amperage of a second current $i_2$. In one embodiment, the current mirror includes two source-coupled PMOS transistors 81, 82. The drain of transistor 81 provides the first current $i_1$. The drain of transistor 82 provides the second drain current $i_2$. The gates of both transistors 81, 82 are coupled together, and further coupled to the drain of transistor 82.

FIG. 8 further depicts NMOS transistor 84, NMOS transistor 86, and second controlled resistance element 88. Transistor 84 has a drain terminal that receives the first current $i_1$, and a source terminal coupled to a voltage reference such as Vss. Transistor 86 has a drain terminal that receives the second current $i_2$ and which together with the drain terminal of transistor 82 forms a bias control node. The source terminal of transistor 86 is coupled to voltage reference Vss through second controlled resistance element 88, which receives as a control input the resistance control signal 64. The gate terminals of transistors 84, 86 are coupled together and further coupled to the drain terminal of transistor 84. Transistor 86 has a channel width to length (Z/L) ratio that is approximately four times the channel width to length (Z/L) ratio of transistor 84.

FIG. 8 also depicts bias transistor $\mathbf{89}_1$, which has a source terminal coupled to the power supply voltage Vcc, and a gate terminal receiving the bias control signal. Additional bias transistors, such as bias transistors $\mathbf{89}_2$–$\mathbf{89}_N$ may be receive the bias control signal at their respective gate terminals and be coupled to the power supply voltage Vcc by their respective source terminals in a similar fashion. The drain terminal of each bias transistor $\mathbf{89}_1$–$\mathbf{89}_N$ may be coupled to additional circuitry to provide bias currents to such corresponding additional circuitry, as discussed previously, and the width to length (Z/L) ratios of the bias transistors $\mathbf{89}_2$–$\mathbf{89}_N$ may be adjusted to provide appropriate scaling of the bias currents $i_{bias1}$–$i_{biasN}$.

The circuit of transistors 84, 86, and second controlled resistance element 88 provides a bias current $i_1$ that is approximately proportional to the inverse of the square of the resistance Rc2 across the second controlled resistance element 88. Thus, as described below, the transconductance gm of transistor 84 is proportional to the inverse of resistance Rc2. Because the resistance Rc2 is inversely proportional to the frequency of the clock signal 69 when connected to the circuits shown in FIGS. 6 and 7, the transconductance gm of transistor 84 is increased linearly proportionally with respect to the increase of the frequency of the clock signal 69.

This is a particularly desirable relationship, because an integrated circuit typically may operate at a speed which is dependent upon a ratio of gm/C, where gm is the transconductance of a MOS device providing a current to a capacitor having a capacitance C. Thus, if the operating speed of a circuit is decreased by half, then only one-half the transconductance gm is required, which implies that only one-fourth the bias current $i_{bias}$ is required.

With respect to FIG. 8 as discussed above, the current mirror 80 provides bias current $i_1$ and second current $i_2$ to be of substantially equal amperages. The gate-source voltage Vgs84 of transistor 84 is equal to a sum of the gate-source voltage Vgs86 of transistor 86 and the voltage $V_R$ across second controlled resistance element 88. In general, the drain current Id(sat) of a MOS transistor in a saturation state may be represented by the equation:

$$i_d(sat)=(Z/2L)\mu_n C_i(Vgs-Vt)^2 \tag{1}$$

where:

Z is the channel width of the depletion layer of the MOS device 88;

L is the channel length or depth of the depletion layer of the MOS device 88;

$\mu_n$ is the surface electron mobility;

$C_i$ is the insulator capacitance;

Vgs is the gate-source voltage; and

Vt is the threshold voltage.

(See, for example, Ben G. Streetman, *Solid State Electronic Devices* (2nd ed. 1984), at p 311–14, incorporated by reference herein)

Therefore, the second current $i_2$ may be represented by the equation $$i_2=(Z/2L)\mu_n C_i(Vgs86-Vt)^2 \tag{2}$$

which is also equal to the bias current $i_1$ drawn by the drain of transistor 84 due to the functionality of current mirror 80. Because transistor 84 has a width to length (Z/L) ratio approximately one-fourth of the width to length (Z/L) ratio of transistor 86, the current $i_1$ may be represented by the equation:

$$i_1=(Z/8L)\mu_n C_i(Vgs84-Vt)^2 \quad (3)$$

The gate-source voltage Vgs84 of transistor 84 is equal to the bias control voltage, which is also equal to the sum of the gate-source voltage Vgs86 of transistor 86 and the voltage Vr across controlled resistance element 88, i.e.:

$$Vgs84Vgs86+Vr \quad (4)$$

The voltage Vr across controlled the resistance Rc2 resistance element 88 is given by the equation $$Vr=i_2Rc2 \quad (5)$$

Equations (2) and (3) may be combined, because bias current $i_1$ is equal to second current $i_2$, as follows:

$$i_1=(Z/2L)\mu_n C_i(Vgs86-Vt)^2=i_2=(Z/8L)\mu_n C_i(Vgs84-Vt)^2 \quad (6)$$

$$(Vgs86-Vt)^2=(1/4)(Vgs84-Vt)^2 \quad (7)$$

or $$2(Vgs86-Vt)=(Vgs84-Vt) \quad (8)$$

Substituting equations (4) and (5):

$$2(Vgs86-Vt)=(Vgs86+i_2\,Rc2-Vt) \quad (9)$$

$$i_2\,Rc2=(Vgs86-Vt) \quad (10)$$

or $$i_2^2(Rc2)^2=(Vgs86-Vt)^2 \quad (11)$$

From equation (2):

$$(Vgs86-Vt)^2=i_2/((Z/2L)\mu_n C_i) \quad (12)$$

Substituting equation (12) into equation (11) yields:

$$i_2^2(Rc2)^2=i_2/((Z/2L)\mu_n C_i);\text{ or} \quad (13)$$

$$i_2=i_1=1/((Z/2L)\mu_n C_i(Rc2)^2) \quad (14)$$

Because all other factors in equation (14) are constants except for bias current $i_1$ and resistance Rc2, the circuit of FIG. 8 provides a bias current $i_1$ which is dependent only upon the inverse of the square of resistance Rc2.

The transconductance gm of a MOS device in saturation is given by the equation:

$$gm(sat)=(Z/L)\mu_n C_i(Vgs-Vt) \quad (15)$$

Substituting the appropriate terms from equation (14) for transistor 86 yields:

$$gm=2(Vgs86-Vt)/(i_2(Rc2)^2) \quad (16)$$

since $i_1=i_2$ and from equation (10) $i_1$ Rc2=(Vgs86−Vt)

$$gm=2/Rc2 \quad (17)$$

Thus, the circuit of FIG. 8 provides a transconductance gm which is inversely linearly proportional to controlled resistance Rc2. As discussed above, such a relationship provides a bias current $i_1$ that is appropriately scaled with respect to the operating frequency of an integrated circuit. Because the bias current $i_1$ is equal to the second current $i_2$, and the bias control node is coupled to the gates of bias transistors $\mathbf{89}_1$–$\mathbf{89}_N$, additional bias currents $i_{bias1}$–$i_{biasN}$ are each controlled to have a magnitude appropriately scaled with respect to the operating frequency of the integrated circuit.

(For a further discussion of a bias circuit which produces a bias current that is dependent only upon the inverse of the square of resistance and a transconductance that is dependent upon an inverse of a resistance, see John M. Steininger, "Understanding Wide-band MOS Transistors," Circuits and Devices, May 1990, incorporated by reference herein).

The devices of the different subcircuits of an integrated circuit may also be fabricated to provide similar characteristics in the presence of environmental factors such as temperature. For example, each device of FIGS. 6–8 may be manufactured with a similar fabrication process. Such fabrication control will further facilitate the controlled scaling of the bias current $i_{bias}$ with respect to operating frequency.

Figure 9:
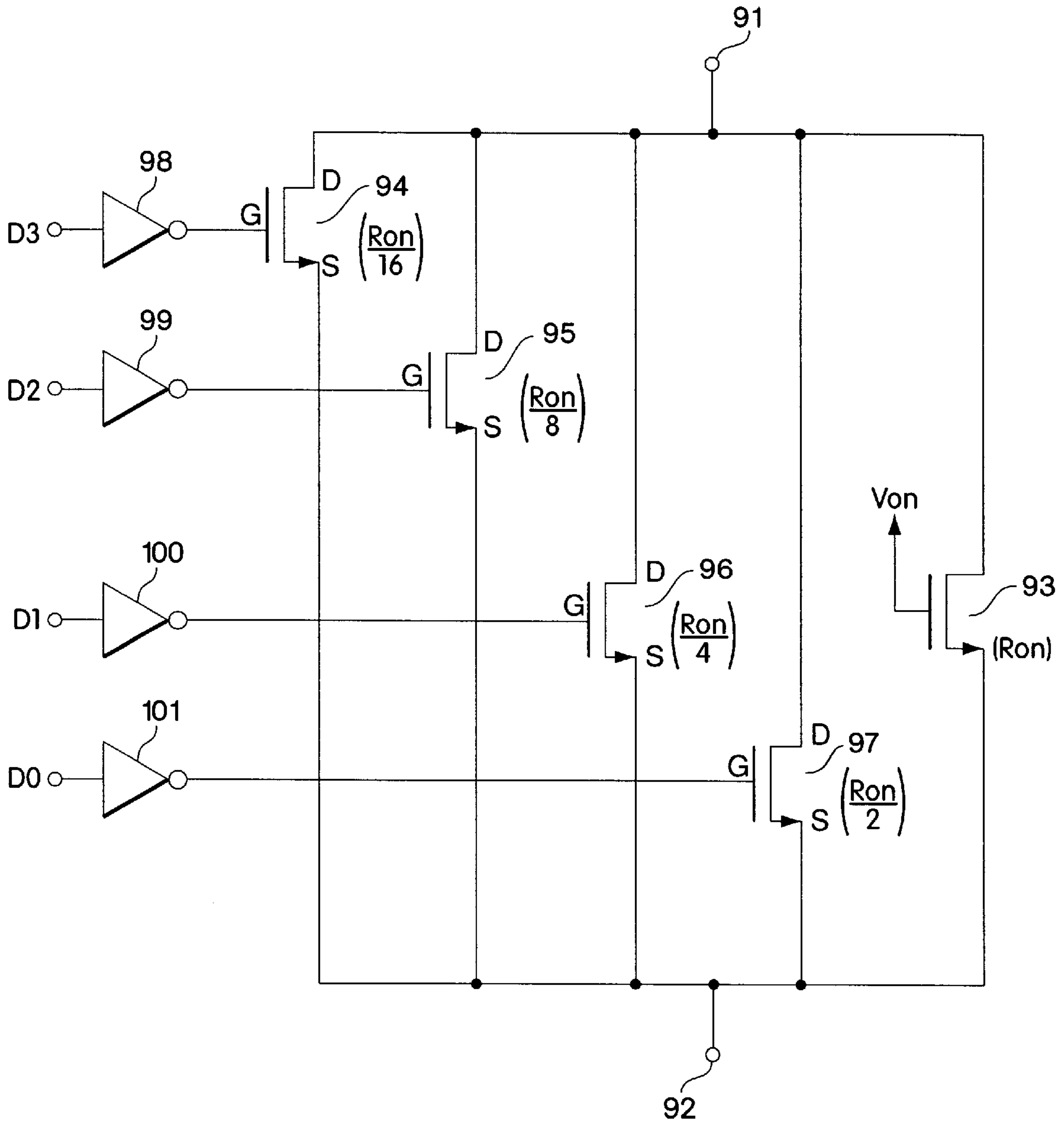
FIG. 9 is a circuit diagram of a controlled resistance which may be implemented in the circuits of FIGS. 6 and 8.

FIG. 9 is a circuit diagram of a controlled resistance circuit which represents an embodiment of the first controlled resistance element 65 of FIG. 6, and the second controlled resistance element 88 of FIG. 8. Generally, any device which provides a resistance that varies in response to an input control signal may be implemented as controlled resistance elements 65 and 88. The embodiment depicted in FIG. 9 includes NMOS transistors 93, 94, 95, 96, and 97, each having a drain terminal connected to a first resistance terminal 91 of the controlled resistance circuit. Each transistor 93–97 further has a source terminal connected to a second resistance terminal 92 of the controlled resistance circuit. The gate terminal of transistor 93 is coupled to an appropriate "on" voltage Von, sufficient to activate the transistor 93 at a resistance $R_{ON}$. The gate terminal of each of transistors 94–97 is coupled to resistance control signal 64 represented by signals D0–D3. In one embodiment, signals D0–D3 are generated by binary counter 70. In particular, signal D3 is coupled through inverter 98 to the gate terminal of transistor 94, signal D2 is coupled through inverter 99 to the gate terminal of transistor 95, signal D1 is coupled through inverter 100 to the gate terminal of transistor 96, and signal D0 is coupled through inverter 101 to the gate terminal of transistor 97. Inverters 98–101 serve to provide signal inversion as well as appropriate "on" and "off" voltages for respective transistors 94–97.

In one embodiment, transistors 93–97 are fabricated with controlled on resistances, for example by controlling the channel width to length (Z/L) ratios of these devices. In particular, the on resistance across transistor 97 is one-half the on resistance $R_{ON}$ across transistor 93. Similarly, the on resistance across transistor 96 is one-fourth the on resistance $R_{ON}$ across transistor 93, the on resistance across transistor 95 is one-eighth the on resistance $R_{ON}$ across transistor 93, and the on resistance across transistor 98 is one-sixteenth the on resistance $R_{ON}$ across transistor 93. When all inputs D0–D3 are at a low level all transistors 93–97 are on and therefore a low total resistance is presented. The total resistance between first resistance terminal 91 and second resistance terminal 92 is a parallel combination of all transistors 93–97.

Conversely, when all inputs D0–D3 are at a high level, the total resistance between first resistance terminal 91 and second resistance terminal 92 is at a high level (e.g., $R_{ON}$). Due to the on resistance weighting as depicted in FIG. 9 and described above, the switching of signal D1 will have approximately twice the affect on the total resistance as the switching of signal D0. Similarly, the switching of signal D2 will have approximately twice the affect as the switching of signal D1, and the switching of signal D3 will have approximately twice the affect as the switching of signal D2. Thus, the total resistance is approximately linearly proportional to the 4-bit binary signal represented by signals D0–D3, and the first controlled resistance Rc1 and the second controlled resistance Rc2 will each have a magnitude approximately proportional to the magnitude of resistance control signal 64.

Alternatively, the on resistance across each of transistors 93–97 may be selected to be precisely proportional to the input signals D0–D3. Additionally, other combinations of on resistances may be implemented to provide other relationships different from a linear relationship between input signals D0–D3 and total resistance.

Other controlled resistances may be use in practicing this invention as will be known to those skilled in the art. For example, resistance control signal 64 may be an analog signal that controls the controlled resistance Rc1 and controlled resistance Rc2. In such an implementation, each controlled resistance element 65, 88 may be a MOS transistor or a combination of MOS transistors operating in the active region.

Having thus described at least one embodiment of the invention, various alterations, modifications, and improvements will readily occur to those skilled in the art. Such alterations, modifications, and improvements are intended to be within the spirit and scope of the invention. For example, the bias current generator may receive signals other than a clock signal upon which the bias current is based, such as a data strobe signal. Furthermore, various substitutions may be made for the various components disclosed, such as replacing a MOS transistor of a first type with a bipolar transistor or a MOS transistor of a second type. Accordingly, the foregoing description is by way of example only, and not intended to be limiting. The invention is limited only as defined in the following claims and the equivalents thereto.

What is claimed is:

1. A method for controlling a bias current of a circuit operating at an operating speed, the method comprising the steps of:

receiving an input signal having a frequency indicative of the operating speed of the circuit;

generating an intermediate signal having a magnitude that is a function of the operating speed and a controlled value:

controlling the controlled value to maintain the intermediate signal within a predetermined range; and controlling the bias current to have a magnitude that is a function of the controlled value, to generate the bias current to have a magnitude that is a function of the frequency of the input signal.

2. The method of claim 1, wherein the step of generating includes generating the bias current to have a magnitude that is substantially linearly proportional to the operating speed.

3. The method of claim 1, wherein the step of generating includes generating the bias current to have a magnitude that is substantially proportional to a square of the operating speed.

4. The method of claim 1, wherein the step of generating an intermediate signal includes providing an intermediate signal having a magnitude that is a function of the operating frequency and a controlled resistance.

5. The method of claim 4, wherein:

the step of controlling the bias current includes controlling the bias current to be proportional to a square of an inverse of the controlled resistance; and the step of providing includes providing an intermediate signal that has a magnitude that is substantially inversely linearly proportional to the operating frequency.

6. The method of claim 1, wherein the step of generating includes the steps of:

generating a bias control current; and generating a plurality of bias currents, each having a respective magnitude that is substantially linearly proportional to the bias control current.

7. The method of claim 6, further comprising a step of distributing the plurality of bias currents to a respective plurality of subcircuits on an integrated circuit.

8. The method of claim 1, wherein the step of receiving includes receiving a clock signal of the circuit.

9. The method of claim 1, wherein the step of receiving includes receiving a data strobe signal of the circuit.

10. A method for controlling a bias current of an integrated circuit having an operating frequency, the method comprising the steps of:

receiving a signal indicative of the operating frequency of the integrated circuit;

generating an intermediate signal having a magnitude that is a function of the operating frequency and a controlled value;

controlling the controlled value to maintain the intermediate signal within a predetermined range; and controlling the bias current to have a magnitude that is a function of the controlled value, to increase the bias current when the signal indicates that the operating frequency of the integrated circuit is increasing; and decreasing the bias current when the signal indicates that the operating frequency of the integrated circuit is decreasing.

11. The method of claim 10, wherein the step of increasing includes increasing the bias current by an amount that is substantially linearly proportional with respect to an amount of increase of the operating frequency.

12. The method of claim 10, wherein the step of increasing includes increasing the bias current by an amount that is substantially proportional to a square of an amount of increase of the operating frequency.

13. The method of claim 10, wherein the step of generating includes providing an intermediate signal having a magnitude that is a function of the operating frequency and a controlled resistance.

14. The method of claim 13, wherein:

the step of controlling the bias current includes controlling the bias current to be proportional to a square of an inverse of the controlled resistance;

the step of providing includes providing an intermediate signal that has a magnitude that is substantially inversely linearly proportional to the operating frequency.

15. The method of claim 10, further comprising the step of generating a plurality of scaled bias currents, each having a respective magnitude that is substantially linearly proportional to the bias current.

16. The method of claim 15, further comprising the step of distributing the plurality of scaled bias currents to a respective plurality of subcircuits on the integrated circuit.

17. The method of claim 10, wherein the step of receiving includes receiving a clock signal of the integrated circuit.

18. The method of claim 10, wherein the step of receiving includes receiving a data strobe signal of the integrated circuit.

19. The method of claim 10, wherein the step of receiving includes receiving a signal having a frequency indicative of the operating frequency.

20. A bias circuit for providing a bias current to an integrated circuit having an operating speed, the bias circuit comprising:

a signal generator having an input that receives an input signal that has a frequency indicative of the operating speed of the integrated circuit, and an output that provides an intermediate signal indicative of the operating speed;

a controllable bias current generator, coupled to the signal generator, having an input that receives to the intermediate signal, and an output that provides a bias current having a magnitude that is a function of the frequency of the input signal; and a feedback controller, having an input that receives the intermediate signal and an output that provides a feedback signal indicative of the operating speed to the input of the controllable bias current generator and to a second input of the signal generator, wherein the feedback controller includes:

a window comparator, having an input that receives the intermediate signal and an output providing a control signal indicative of whether the intermediate signal is within a predetermined range; and a binary counter, having an input that receives the control signal, and an output that provides a resistance control signal as the feedback signal in response to the control signal.

21. The bias circuit of claim 20, wherein the signal generator includes:

a controlled resistance;

a controlled switch, responsive to the input signal; and an integration circuit, having a first input that receives a signal indicative of the controlled resistance and a second input receiving a signal indicative of a position of the controlled switch, and an output that provides the intermediate signal as a function of the controlled resistance and the controlled switch.

22. The bias circuit of claim 21, wherein the controlled resistance is responsive to the feedback signal, and wherein the controllable bias current generator includes:

a current mirror providing a first current and a second current having a magnitude substantially equal to the first current;

a second controlled resistance responsive to the feedback signal; and a plurality of transistors constructed and arranged to control the bias current to have a magnitude substantially proportional to an inverse of the second controlled resistance.

23. The bias circuit of claim 20, wherein the controllable bias current generator includes:

a current mirror providing a first current and a second current having a magnitude substantially equal to the first current;

a controlled resistance; and a plurality of transistors constructed and arranged to control the bias current to have a magnitude substantially proportional to an inverse of the controlled resistance.

24. The bias circuit of claim 20, wherein the output of the controllable bias current generator has a magnitude that is substantially inversely linearly proportional to the operating speed.

25. The bias circuit of claim 20, wherein the output of the controllable bias current generator has a magnitude that is substantially proportional to a square of the operating speed.

26. The bias circuit of claim 20, wherein the input signal includes a clock signal of the integrated circuit.

27. The bias circuit of claim 20, wherein the input signal includes a data strobe signal of the integrated circuit.

28. The bias circuit of claim 20, wherein the controllable bias current generator includes:

a first circuit having an output that provides a bias current control signal having a magnitude that is a function of the frequency of the input signal; and a second circuit having an input that receives the bias control signal and a plurality of outputs that provide a plurality of bias currents, each having a respective magnitude substantially linearly proportional to the magnitude of the bias control signal.

29. The bias circuit of claim 28, wherein each of the plurality of bias currents is distributed to one of a respective plurality of subcircuits on the integrated circuit.

30. An apparatus for controlling a bias current of a circuit having an operating speed, the apparatus comprising:

means for receiving an input signal having a frequency indicative of the operating speed of the circuit; and means, coupled to the means for receiving, for generating the bias current to have a magnitude that is a function of the frequency of the input signal, wherein the means for generating includes:

means for generating an intermediate signal having a magnitude that is a function of the operating speed and a controlled value;

means for controlling the controlled value to maintain the intermediate signal within a predetermined range; and means for controlling the bias current to have a magnitude that is a function of the controlled value.

31. The apparatus of claim 30, wherein the means for generating includes means for generating the bias current to have a magnitude that, is substantially linearly proportional to the operating speed.

32. The apparatus of claim 30, wherein the means for generating includes means for generating the bias current to have a magnitude that is substantially proportional to a square of the operating speed.

33. The apparatus of claim 30, wherein the means for generating an intermediate signal includes means for providing an intermediate signal having a magnitude that is a function of the operating frequency and a controlled resistance.

34. The apparatus of claim 33, wherein:

the means for controlling the bias current includes means for controlling the bias current to be proportional to a square of an inverse of the controlled resistance; and the means for providing includes means for providing an intermediate signal that has a magnitude that is substantially inversely linearly proportional to the operating frequency.

35. The apparatus of claim 30, wherein the means for generating includes:

means for generating a bias control current; and means for generating a plurality of bias currents, each having a respective magnitude that is substantially linearly proportional to the bias control current.

36. The apparatus of claim 35, further comprising means for distributing the plurality of bias currents to a respective plurality of subcircuits on an integrated circuit.

37. The apparatus of claim 30, wherein the means for receiving includes means for receiving a clock signal of the circuit.

38. The apparatus of claim 30, wherein the means for receiving includes means for receiving a data strobe signal of the circuit.

39. An apparatus for controlling a bias current of an integrated circuit having an operating frequency, the apparatus comprising:

means for receiving a signal indicative of the operating frequency of the integrated circuit; and means for increasing the bias current when the signal indicates that the operating frequency of the integrated circuit is increasing, and for decreasing the bias current when the signal indicates that the operating frequency of the integrated circuit is decreasing; wherein the means for increasing includes:

means for generating an intermediate signal having a magnitude that is a function of the operating frequency and a controlled value;

means for controlling the controlled value to maintain the intermediate signal within a predetermined range; and means for controlling the bias current to have a magnitude that is a function of the controlled value.

40. The apparatus of claim 39, wherein the means for increasing includes means for increasing the bias current by an amount that is substantially linearly proportional with respect to an amount of increase of the operating frequency.

41. The apparatus of claim 39, wherein the means for increasing includes means for increasing the bias current by an amount that is substantially proportional to a square of an amount of increase of the operating frequency.

42. The apparatus of claim 39, wherein the means for generating includes means for providing an intermediate signal having a magnitude that is a function of the operating frequency and a controlled resistance.

43. The apparatus of claim 42, wherein:

the means for controlling the bias current includes means for controlling the bias current to be proportional to a square of an inverse of the controlled resistance;

the means for providing includes means for providing an intermediate signal that has a magnitude that is substantially inversely linearly proportional to the operating frequency.

44. The apparatus of claim 39, further comprising means for generating a plurality of scaled bias currents, each having a respective magnitude that is substantially linearly proportional to the bias current.

45. The apparatus of claim 44, further comprising means for distributing the plurality of scaled bias currents to a respective plurality of subcircuits on the integrated circuit.

46. The apparatus of claim 39, wherein the means for receiving includes means for receiving a clock signal of the integrated circuit.

47. The apparatus of claim 39, wherein the means for receiving includes means for receiving a data strobe signal of the integrated circuit.

48. The apparatus of claim 39, wherein the means for receiving includes means for receiving a signal having a frequency indicative of the operating frequency.

49. A bias circuit for providing a bias current to an integrated circuit having an operating speed, the bias circuit comprising:

a signal generator having an input that receives an input signal that has a frequency indicative of the operating speed of the integrated circuit, and an output that provides an intermediate signal indicative of the operating speed; and a controllable bias current generator, coupled to the signal generator, having an input that receives to the intermediate signal, and an output that provides a bias current having a magnitude that is a function of the frequency of the input signal, wherein the signal generator includes:

a controlled resistance;

a controlled switch, responsive to the input signal; and an integration circuit, having a first input that receives a signal indicative of the controlled resistance and a second input receiving a signal indicative of a position of the controlled switch, and an output that provides the intermediate signal as a function of the controlled resistance and the controlled switch.

50. The bias circuit of claim 49, wherein the controlled resistance is responsive to the feedback signal, and wherein the controllable bias current generator includes:

a current mirror providing a first current and a second current having a magnitude substantially equal to the first current;

a second controlled resistance responsive to the feedback signal; and a plurality of transistors constructed and arranged to control the bias current to have a magnitude substantially proportional to an inverse of the second controlled resistance.

51. The bias circuit of claim 49, wherein the controllable bias current generator includes:

a current mirror providing a first current and a second current having a magnitude substantially equal to the first current;

a controlled resistance; and a plurality of transistors constructed and arranged to control the bias current to have a magnitude substantially proportional to an inverse of the controlled resistance.

52. The bias circuit of claim 49, wherein the output of the controllable bias current generator has a magnitude that is substantially inversely linearly proportional to the operating speed.

53. The bias circuit of claim 49, wherein the output of the controllable bias current generator has a magnitude that is substantially proportional to a square of the operating speed.

54. The bias circuit of claim 49, wherein the input signal includes a clock signal of the integrated circuit.

55. The bias circuit of claim 49, wherein the input signal includes a data strobe signal of the integrated circuit.

56. The bias circuit of claim 49, wherein the controllable bias current generator includes:

a first circuit having an output that provides a bias current control signal having a magnitude that is a function of the frequency of the input signal; and a second circuit having an input that receives the bias control signal and a plurality of outputs that provide a plurality of bias currents, each having a respective magnitude substantially linearly proportional to the magnitude of the bias control signal.

57. The bias circuit of claim 56, wherein each of the plurality of bias currents is distributed to one of a respective plurality of subcircuits on the integrated circuit.

58. A bias circuit for providing a bias current to an integrated circuit having an operating speed, the bias circuit comprising:

a signal generator having an input that receives an input signal that has a frequency indicative of the operating speed of the integrated circuit, and an output that provides an intermediate signal indicative of the operating speed; and a controllable bias current generator, coupled to the signal generator, having an input that receives to the intermediate signal, and an output that provides a bias current having a magnitude that is a function of the frequency of the input signal, wherein the controllable bias current generator includes:

a current mirror providing a first current and a second current having a magnitude substantially equal to the first current;

a controlled resistance; and a plurality of transistors constructed and arranged to control the bias current to have a magnitude substantially proportional to an inverse of the controlled resistance.

59. The bias circuit of claim 58, wherein the output of the controllable bias current generator has a magnitude that is substantially inversely linearly proportional to the operating speed.

60. The bias circuit of claim 58, wherein the output of the controllable bias current generator has a magnitude that is substantially proportional to a square of the operating speed.

61. The bias circuit of claim 58, wherein the input signal includes a clock signal of the integrated circuit.

62. The bias circuit of claim 58, wherein the input signal includes a data strobe signal of the integrated circuit.

63. The bias circuit of claim 58, wherein the controllable bias current generator includes:

a first circuit having an output that provides a bias current control signal having a magnitude that is a function of the frequency of the input signal; and a second circuit having an input that receives the bias control signal and a plurality of outputs that provide a plurality of bias currents, each having a respective magnitude substantially linearly proportional to the magnitude of the bias control signal.

64. The bias circuit of claim 63, wherein each of the plurality of bias currents is distributed to one of a respective plurality of subcircuits on the integrated circuit.

* * * * *